United States Patent
Vinet et al.

(10) Patent No.: US 7,473,588 B2
(45) Date of Patent: Jan. 6, 2009

(54) METHOD FOR INSULATING PATTERNS FORMED IN A THIN FILM OF OXIDIZABLE SEMI-CONDUCTING MATERIAL

(75) Inventors: Maud Vinet, Grenoble (FR);
Jean-Charles Barbe, Grenoble (FR);
Bernard Previtali, Grenoble (FR);
Thierry Poiroux, Voreppe (FR)

(73) Assignee: Commissariat A l'Energie Atomique, Paris (FR)

( * ) Notice: Subject to any disclaimer, the term of this patent is extended or adjusted under 35 U.S.C. 154(b) by 448 days.

(21) Appl. No.: 11/291,918

(22) Filed: Dec. 2, 2005

(65) Prior Publication Data
US 2006/0121653 A1    Jun. 8, 2006

(30) Foreign Application Priority Data
Dec. 8, 2004    (FR) ................... 04 13061

(51) Int. Cl.
*H01L 21/00* (2006.01)
(52) U.S. Cl. ................. 438/149; 438/151; 438/164; 438/479; 438/669; 438/671
(58) Field of Classification Search .......... 438/149
See application file for complete search history.

(56) References Cited

U.S. PATENT DOCUMENTS

| | | | | |
|---|---|---|---|---|
| 3,341,753 A | * | 9/1967 | Cunningham et al. | 257/763 |
| 4,407,696 A | * | 10/1983 | Han et al. | 438/448 |
| 4,764,248 A | * | 8/1988 | Bhattacherjee et al. | 438/439 |
| 4,819,040 A | * | 4/1989 | Tobin | 257/369 |
| 4,927,780 A | * | 5/1990 | Roth et al. | 438/444 |
| 5,120,675 A | * | 6/1992 | Pollack | 438/412 |
| 5,149,669 A | * | 9/1992 | Hosaka | 438/444 |
| 5,175,123 A | * | 12/1992 | Vasquez et al. | 438/448 |
| 5,358,893 A | * | 10/1994 | Yang et al. | 438/448 |
| 5,360,753 A | * | 11/1994 | Park et al. | 438/421 |
| 5,374,584 A | * | 12/1994 | Lee et al. | 438/445 |
| 5,374,585 A | * | 12/1994 | Smith et al. | 438/443 |
| 5,393,692 A | | 2/1995 | Wu | |
| 5,432,118 A | * | 7/1995 | Orlowski et al. | 438/444 |
| 5,451,540 A | * | 9/1995 | Kawaguchi et al. | 438/448 |
| 5,457,067 A | * | 10/1995 | Han | 438/442 |
| 5,607,543 A | * | 3/1997 | Eisenberg et al. | 438/751 |
| 5,629,230 A | * | 5/1997 | Fazan et al. | 438/446 |
| 5,658,381 A | * | 8/1997 | Thakur et al. | 257/309 |

(Continued)

*Primary Examiner*—N Drew Richards
*Assistant Examiner*—Ankush K Singal
(74) *Attorney, Agent, or Firm*—Oliff & Berridge, PLC

(57) ABSTRACT

A method for insulating patterns formed in a thin film made of a first oxidizable semi-conducting material, with a thickness less than or equal to 20 nm and preferably less than or equal to 10 nm, successively comprises:

formation, on the thin film, of a mask defining, in the thin film, free zones and zones covered by the mask designed to substantially form the patterns, selective formation, at the level of the free zones of the thin film, of an additional layer formed by an oxide of a second semi-conducting material, oxidization of the free zones of the thin film, removal of the mask so as to release the thin film patterned in the form of patterns insulated by oxidized zones.

The first and second semi-conducting materials can be identical and the step of selective formation of the additional layer can be performed by selective epitaxial growth of the free zones of the thin film.

17 Claims, 3 Drawing Sheets

U.S. PATENT DOCUMENTS

| | | | | |
|---|---|---|---|---|
| 5,696,021 | A * | 12/1997 | Chan et al. | 438/425 |
| 5,880,004 | A * | 3/1999 | Ho | 438/421 |
| 5,894,059 | A * | 4/1999 | Peidous et al. | 430/316 |
| 5,940,720 | A * | 8/1999 | Hong | 438/445 |
| 5,956,600 | A * | 9/1999 | Kuroi et al. | 438/446 |
| 6,063,690 | A * | 5/2000 | Woodruff et al. | 438/426 |
| 6,074,933 | A * | 6/2000 | Ma et al. | 438/443 |
| 6,083,810 | A * | 7/2000 | Obeng et al. | 438/448 |
| 6,091,076 | A * | 7/2000 | Deleonibus | 257/24 |
| 6,093,622 | A * | 7/2000 | Ahn et al. | 438/439 |
| 6,127,242 | A * | 10/2000 | Batra et al. | 438/440 |
| 6,197,662 | B1 * | 3/2001 | Chan | 438/439 |
| 6,243,311 | B1 * | 6/2001 | Keeth | 365/206 |
| 6,261,926 | B1 * | 7/2001 | King | 438/439 |
| 6,306,726 | B1 * | 10/2001 | Kwok | 438/439 |
| 6,306,727 | B1 * | 10/2001 | Akram | 438/444 |
| 6,316,300 | B1 * | 11/2001 | Ozeki et al. | 438/197 |
| 6,566,680 | B1 * | 5/2003 | Krivokapic | 257/30 |
| 6,809,395 | B1 * | 10/2004 | Gonzales et al. | 257/510 |
| 6,967,369 | B1 * | 11/2005 | Keeth et al. | 257/296 |
| 7,173,302 | B2 * | 2/2007 | Brederlow et al. | 257/296 |
| 2004/0009677 | A1 * | 1/2004 | Kim | 438/778 |
| 2006/0091493 | A1 * | 5/2006 | Wu | 257/484 |

* cited by examiner

METHOD FOR INSULATING PATTERNS FORMED IN A THIN FILM OF OXIDIZABLE SEMI-CONDUCTING MATERIAL

BACKGROUND OF THE INVENTION

The invention relates to a method for insulating patterns formed in a thin film made of a first oxidizable semi-conducting material with a predetermined thickness less than or equal to 20 nm and arranged on a support, successively comprising:
formation, on the thin film, of a mask defining, in the thin film, free zones and zones covered by the mask designed to substantially form the patterns,
oxidation of the free zones of the thin film,
removal of the mask so as to release the thin film patterned in the form of patterns insulated by oxidized zones.

STATE OF THE ART

In a large number of microelectronics fields, the devices achieved by conventional technologies on bulk silicon are being increasingly replaced by devices on Silicon on Insulator (SOI) substrate or on strained SOI substrate. A SOI substrate is formed by a silicon substrate on which an insulating layer is deposited, for example an oxide layer, covered by a thin film of silicon. A strained SOI substrate is a SOI substrate on which a thin film of strained or stressed silicon is deposited. Such SOI substrates provide an electrical insulation of the micro-components designed to be integrated, such as MOS transistors, with respect to the substrate, due to the presence of the buried insulator layer deposited on the silicon substrate. They also ensure a reduction of stray capacitances and of short channel effects.

Electrical insulation of the micro-components or silicon patterns is generally completed by local thermal oxidation of silicon. Insulation by local oxidation of silicon, also known under the name of LOCOS insulation, is performed by means of a patterned mask formed by at least two superposed layers of oxide and nitride arranged on the silicon thin film. Silicon zones can then be formed by LOCOS insulation in the thin film, these silicon zones forming patterns that are separate, and therefore electrically insulated from one another by oxidized zones.

However, when the patterns, formed in a thin film and possibly insulated by LOCOS, have a thickness less than or equal to 20 nm, a dewetting phenomenon of the patterns in solid phase tends to occur at high temperature when the micro-components are fabricated. This phenomenon is generally observed in the annealing steps that are performed above 850° C. and for example at 950° C.

The patterns formed in the silicon thin film are in fact intrinsically unstable and they evolve spontaneously towards a form of equilibrium achieved by material transportation, mostly by surface diffusion, and which, in extreme cases, corresponds to a population of crystals disjointed from one another. The energy of the system formed by this population of crystals is then smaller than that of the initial pattern. This form of equilibrium is therefore detrimental for the subsequent micro-component fabrication steps, in particular for fabrication of a MOS transistor where the different zones of the transistor to be defined in the thin pattern, for example the source, drain, channel, etc. may no longer be connected. Such a dewetting phenomenon also occurs for any type of patterned thin film made of semi-conducting material able to form a stable oxide when thermal oxidation is performed, such as for example a silicon and germanium compound (SiGe).

As this phenomenon is induced by the high temperature of the micro-component fabrication steps and in particular the annealing steps, it has been attempted to perform annealing at a less high temperature. Indeed, for thin film thicknesses of about 5 nm and for usual annealing times and atmospheres, performing annealing at a temperature of less than 800° C. makes the thin films hardly sensitive to dewetting. However, the following steps, for example the cleaning step which requires species desorption or the epitaxy step, do not enable such an annealing temperature to be used since, to obtain an interface able to ensure a good crystalline quality of the epitaxied material, the annealing temperature can not be less than 800° C.

OBJECT OF THE INVENTION

The object of the invention is to provide a method for insulating patterns formed in a thin film of oxidizable semi-conducting material with a predetermined thickness less than or equal to 20 nm, and preferably less than or equal to 10 nm, enabling the shortcomings of the prior art to be overcome.

More particularly, the method for insulating patterns not only enables the patterns to be electrically insulated from one another but also enables them to be made stable at the high temperatures used during certain micro-component fabrication steps.

This object is achieved by the accompanying claims.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

According to a particular embodiment represented in FIGS. 1 to 8, patterns 1*a* are formed in a thin film 1 arranged on a support 3 and are separated from one another by oxidized zones 1*b*. The oxidized zones 1*b* not only enable the patterns 1*a* to be electrically insulated from one another but also enable them to be anchored so as to prevent the dewetting phenomenon liable to occur during certain micro-component fabrication steps performed at high temperatures.

The thin film 1 is made of oxidizable semi-conducting material, preferably selected from the group consisting of silicon and a silicon and germanium compound, and it has a predetermined thickness $e_1$ less than or equal to 20 nm, and preferably less than or equal to 10 nm.

Figure 1:
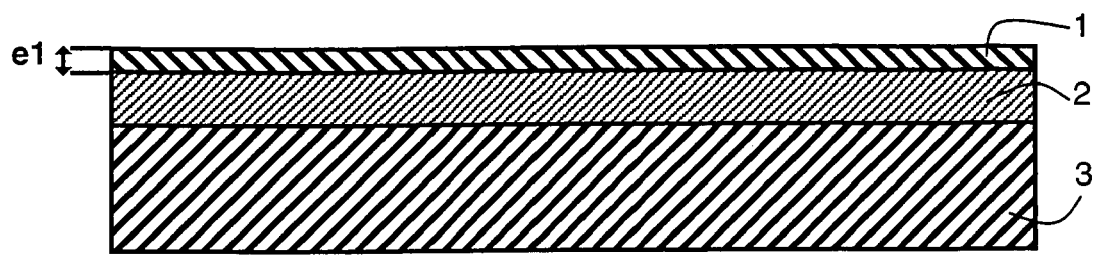
FIGS. 1 to 8 schematically represent, in cross-section, different steps of a particular method for insulating patterns formed in a thin film, according to the invention.

Thus, as represented in FIG. 1, the thin film 1 is previously arranged on the top face of an intermediate layer 2 covering a support 3. More particularly, the material forming the support 3 is different from the oxidizable semi-conducting material of the thin film 1. In the example described, the support 3 is a silicon substrate and the intermediate layer 2 is an electrically insulating layer, the two together then forming a SOI substrate. The electrically insulating layer can be formed by a compound chosen from amorphous silicon, alumina, silicon nitride, quartz and hafnium oxide ($HfO_2$). The intermediate layer 2 can also be a semi-conducting layer formed for example by a silicon and germanium compound.

Figure 2:
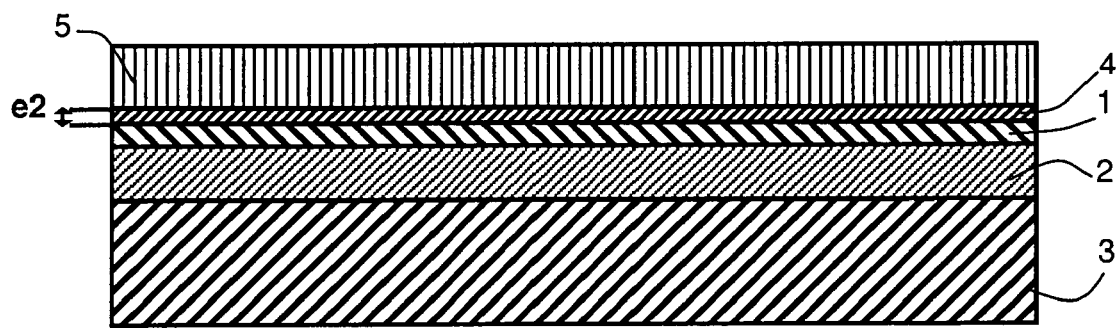

In FIG. 2, two layers, respectively made of oxide 4 and from nitride 5, are successively formed over the whole free surface of the thin film 1. The oxide layer 4, for example made of silicon oxide, preferably has a thickness e2 comprised between 2 nm and 5 nm. It can be formed by low pressure chemical vapor deposition, also referred to as LPCVD, by plasma enhanced chemical vapor deposition, also referred to as PECVD, or by thermal oxidation of a small thickness of the thin film 1. The oxide layer 4 can also be formed by a $SiO_2$/$HfO_2$ stacking, the $SiO_2$ layer being able to be either deposited or formed naturally on the thin film when deposition of the $HfO_2$ layer is performed.

Then a nitride layer 5, for example made of silicon nitride, is deposited over the whole free surface of the oxide layer 4. The nitride layer 5 preferably has a thickness comprised between 10 nm and 70 nm and is for example deposited by LPCVD.

The nitride layer 5 and oxide layer 4 are then patterned in selective manner. Patterning thus stops at the surface of the thin film 1. Patterning is for example performed by photolithography or by a method called "e-beam photolithography" which consists in performing photolithography by means of an electronic mask followed by successive etchings of the nitride layer 5 and oxide layer 4.

Figure 3:
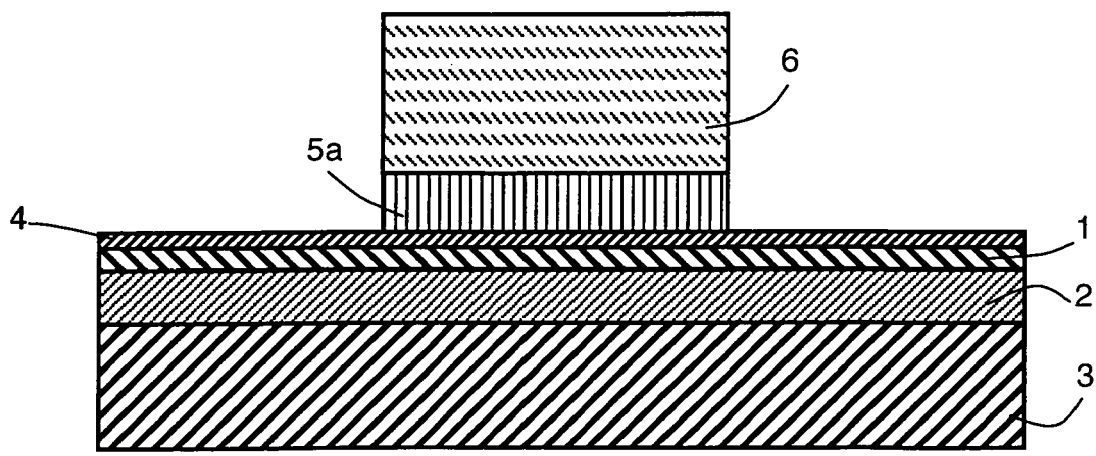

In FIG. 3, the nitride layer 5 is patterned by photolithography by means of a patterned photoresist 6. A layer of photosensitive resin is for example deposited on the free surface of the nitride layer and is patterned in the form of patterns. The patterned photoresist 6 then comprises patterns delineated by open zones letting the free surface of the nitride layer appear. The nitride layer 5 is then etched in the open zones of the patterned photoresist 6, so that the zones of the nitride layer 5 that are not covered by the patterns of the photoresist 6 are eliminated. Etching of the nitride layer 5 is selective in that only the nitride layer 5 is etched, etching stopping at the surface of the oxide layer 4.

Figure 4:
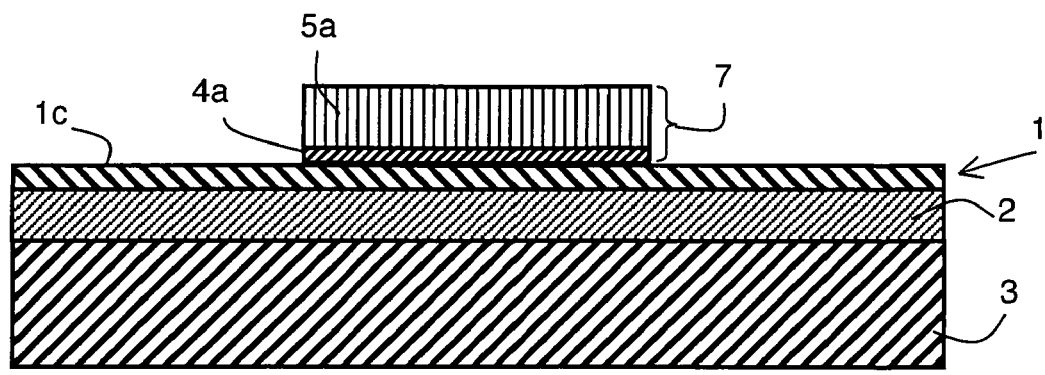

As represented in FIG. 4, the patterned photoresist 6 is then removed before the oxide layer 4 is etched in selective manner through the previously patterned nitride layer 5. Etching of the oxide layer 4 is selective in that only the oxide layer 4 is etched, etching stopping at the surface of the thin film 1. The zones of the oxide layer 4 that are not covered by the patterns of the nitride layer 5 are then eliminated.

Thus, at the outcome of this patterning step, only the previously covered zones 5a and 4a respectively of the nitride layer 5 and of the oxide layer 4 remain on the surface of the thin film 1 and form a mask 7. The mask 7 thus enables two types of zones to be defined in the thin film 1: zones covered by said mask 7 and designed to substantially form the patterns 1a of the thin film 1 and free zones 1c formed by the rest of the thin film 1.

Figure 5:
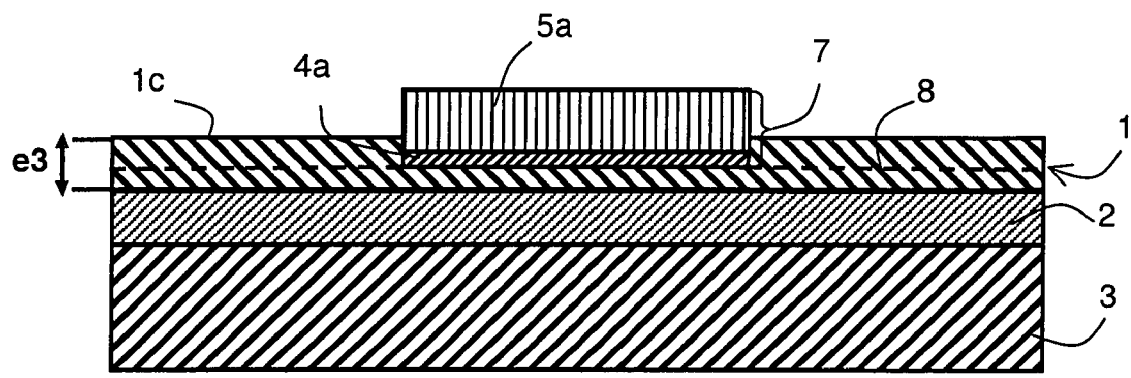

Then, as illustrated in FIG. 5, a selective epitaxy growth step is performed so as to increase the thickness of the free zones 1c, whereas the zones covered by the mask 7 keep a constant thickness corresponding to the thickness e1 of the thin film 1. At the end of the growth step, the free zones 1c have a larger total thickness e3 than the initial thickness e1 of the thin film 1. Epitaxy is selective in that only the free zones 1c of the thin film are subjected to growth by epitaxy, the rest of the thin film 1 being in fact protected by the mask 7 covering it. Thus, in FIG. 5, the broken line 8 illustrates the position of the thin film before the growth step, the level difference between the free surface of the free zones 1c after the growth step and the line 8 then corresponding to the free zones epitaxied during the growth step.

An oxidizing step of the free zones 1c of the thin film is then performed, preferably at high temperature such as for example 1050° C. The oxidizing step not only enables the free zones 1c to be totally oxidized but also enables the patterns 1a to be defined. It is in fact performed through the mask 7, which protects the zones it covers from being oxidized. What is meant by total oxidation of the free zones 1c is that the free zones 1c are oxidized over their whole thickness e3. In addition, oxidation generates an increase of the thickness of the oxidized zones 1b compared with the non-oxidized free zones. Thus, for oxidized zones made of silicon oxide and silicon non-oxidized free zones, this increases corresponds to an increase by a factor 1/0.45, i.e. about 2.22. Thus, the thickness of the free zones 1c being e3, at the end of the oxidation step the oxidized zones 1b have a thickness e4 corresponding substantially to 2.22 times the thickness e3.

Figure 6:
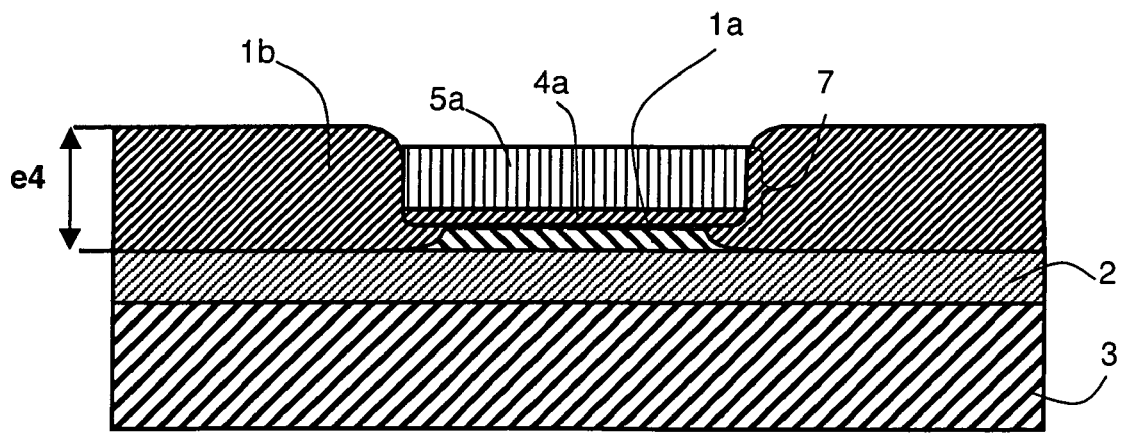

As represented in FIG. 6, the oxidized zones 1b extend under the mask 7 and the interface between the oxidized zones 1b and the patterns 1a is curved. Thus, although the free zones 1b are totally oxidized, the edges of the zones covered by the mask 7 have been partly oxidized so as to form a beak in the silicon patterns 1a. The patterns 1a are then separated from one another and are therefore electrically insulated by the oxidized zones 1b.

Figure 7:
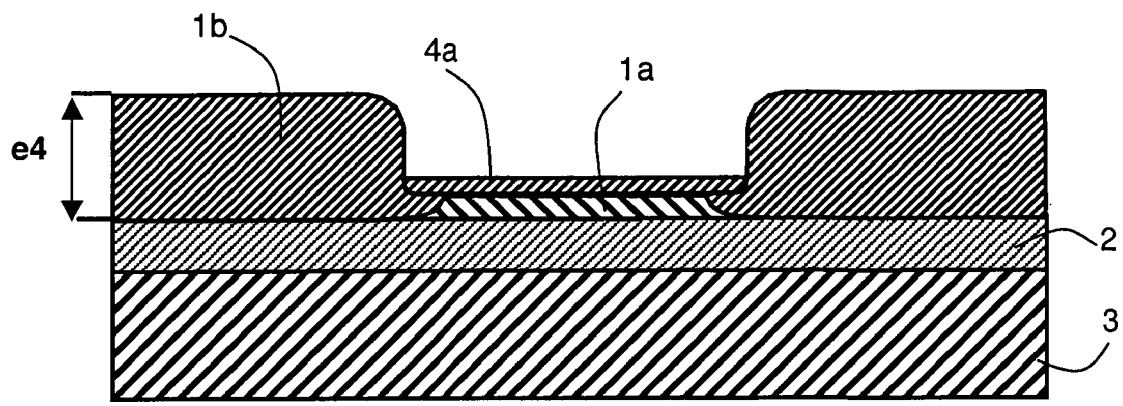
Figure 8:
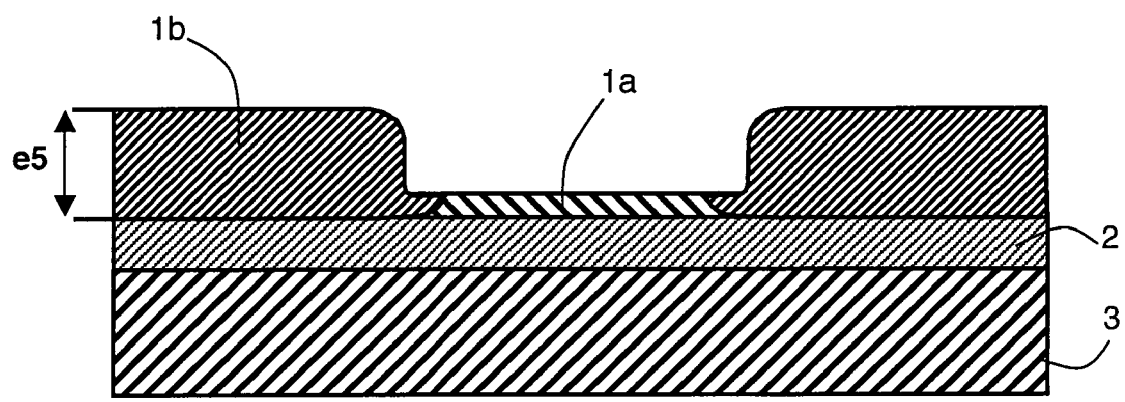

Then as illustrated in FIGS. 7 and 8, the nitride layer 5 and oxide layer 4 are successively removed so as to release the patterns 1a. The nitride layer 5 is for example removed by chemical treatment with for example $H_3PO_4$. A silicon oxide layer 4 is for example removed by means of a hydrofluoric acid solution.

When the method for removing the oxide layer 4 is not selective, such a removal may give rise to partial consumption of the oxidized zones 1b over a thickness dependent on the consumption rate of the oxide of the layer 4 and of the oxide of the oxidized zones 1b. Thus, if the oxides respectively of the free zones 1b and of the layer 4 are identical, the consumed thickness of the free zones when the oxide layer 4 is removed corresponds to the thickness e2 of the oxide layer 4. In this case, the thickness e5 of the oxidized zones 1b, on completion of the insulation step, corresponds to the thickness e4 of the oxidized zones before removal of the oxide layer 4 less the thickness e2 of the oxide layer 4.

Such an insulation method therefore enables patterns to be formed and electrically insulated in a thin film of oxidizable semi-conducting material with a thickness less than or equal to 20 nm and preferably less than or equal to 10 nm. But, unlike LOCOS insulation according to the prior art, it also enables the patterns to be made stable at high temperatures, in particular during the different fabrication steps of a micro-component.

Indeed, such an insulation method enables each pattern to be surrounded, at its periphery, by an oxidized zone, in particular during the different micro-component fabrication steps. This enables thermal stability to be obtained since the oxidized zones surrounding the patterns delay the dewetting phenomenon of the patterns. Moreover, when the intermediate layer 2 is an insulating layer, the interface between a pattern 1a, the oxidized zones 1b surrounding it and the insulating layer 2 constitutes an anchoring point, for it corresponds to a macroscopic roughness which has to be overcome for the pattern to be able to undergo the dewetting phenomenon.

A LOCOS insulation method according to the prior art does not however enable stable patterns at high temperature to be obtained during the different micro-component fabrication steps. In a LOCOS insulation method, the thickness of the oxidized zones does in fact depend on the thickness e1 of the thin film and possibly on the thickness e2 of the oxide layer of the mask. Thus, for a thin film having a thickness e1 less than or equal to 20 nm, and more particularly less than or equal to 10 nm, the thickness of the oxidized zones at the end of a LOCOS insulation method according to the prior art is insufficient to be kept during the different micro-component fabrication steps. For example, for a thin film having a thickness e1 of 8 nm, the oxidized zones in a LOCOS insulation method according to the prior art have a thickness e4 of 17 nm, before the removal step of the oxide layer 4. However, this thickness e4 is completely consumed by etching during the different cleaning steps involved in the fabrication process of a MOS transistor, thus releasing the flanks of the silicon patterns. As the dewetting phenomenon is generally observed in any high temperature step during which the top surface of the pattern and the side walls thereof are free, LOCOS insulation according to the prior art does not enables this phenomenon to be remedied during the different micro-component fabrication steps and in particular during the annealing steps.

Performing a growth step by selective epitaxy, between the mask formation step and the oxidation step of the free zones of the thin film, on the contrary enables oxidized zones to be obtained, at the end of the insulation process, having a sufficient thickness to be kept during the different micro-component fabrication steps. The additional thickness obtained by the selective epitaxy growth step, i.e. formation of epitaxied free zones, does in fact enable the total thickness of the oxidized zones to be increased at the end of the insulation process. The thickness of the epitaxied zones is thus preferably determined in such a way as to preserve oxidized zones on the flanks of the patterns throughout the micro-component fabrication process. The parameters of the selective epitaxy growth step, and more particularly the thickness of the epitaxied zones, are chosen such that the final thickness e5 of the oxidized zones is greater than or equal to 17 nm.

For example, for a silicon thin film with a thickness e1 of 8 nm, with an oxide layer with a thickness of 2 nm, 1 nm of silicon has to be epitaxied to obtain oxides zones presenting a thickness e5 of 18 nm at the end of the insulation process.

In addition, the selective epitaxy growth step is performed on a thin film that is not yet patterned, as the patterns have not yet been formed. The growth step is thus performed "on full wafer", which presents the advantage of not fostering a premature dewetting phenomenon when the insulation process takes place. In addition, if the structure presents internal strains (strained film or composite structure), destabilization phenomena may be observed when the epitaxial growth rate is too low or when the thickness of the epitaxied zones is too great. The selective epitaxy growth conditions, such as the thickness of the epitaxied zones and the epitaxial growth rate, can then be adapted in known manner to prevent these destabilization phenomena.

In an alternative embodiment, the selective epitaxy growth step can be replaced by a selective formation step of an additional layer formed by an oxide of a second semi-conducting material, at the level of the free zones of the thin film. The second semi-conducting material can be identical to or different from the oxidizable semi-conducting material forming the thin film.

Selective formation of the additional layer, at the level of the free zones of the thin film, can be performed by direct selective deposition of the oxide of the second semi-conducting material. In this case, oxidation of the free zones of the thin film is performed through the additional oxide layer.

Selective formation of the additional layer, at the level of the free zones of the thin film, can also be performed by first depositing the second semi-conducting material and then by oxidizing it. Oxidation of the second semi-conducting material can then be performed before oxidation of the free zones of the thin film, which is then performed through the additional oxide layer. Oxidation of the second semi-conducting material can also be performed at the same time as oxidation of the free zones of the thin film. For example, it is possible to deposit selectively, i.e. only on the free zones of the thin film, a silicon and germanium (SiGe) compound on free zones of silicon, silicon on free zones of SiGe, or polysilicon on free zones of silicon or of SiGe. In so far as the second semi-conducting material has a suitable unit cell parameter, selective deposition of the second semi-conducting material on the free zones of the thin film can, for example, be performed by selective epitaxial growth of the free zones of the thin film.

Performing a selective formation step of an additional layer formed by an oxide of a semi-conducting material enables oxidized zones having a sufficient thickness to be kept during the different micro-component fabrication steps to be obtained, as previously, at the end of the insulation process. The additional thickness obtained by formation of the additional layer does, in fact, enable the total thickness of the oxidized zones to be increased, at the end of the insulation process, and therefore enables patterns to be obtained that are not only electrically insulated but also stable at high temperature during the different micro-component fabrication steps.

In another alternative embodiment, the oxide layer 4 of the mask may not be patterned. In this case, the nitride layer 5 of the mask 7 delineates, as previously, zones in the thin film 1 called zones covered by the mask 7, i.e. both by the oxide layer 4 and by the nitride layer 5, and zones called free zones 1c, i.e. zones covered by the oxide layer 4 only. Selective formation of the additional layer is then performed on this thin oxide layer 4 at the level of the zones called free zones only.

The invention is not limited to the embodiments described above. Thus, the thin film 1 is not necessarily arranged on a SOI substrate, i.e. on an intermediate layer 2 covering a support 3. The thin film can be arranged directly on the support. The support can then be a bulk substrate, for example a silicon substrate, or it can be composed of a stacking of several layers of one or more materials.

The invention claimed is:

1. Method for insulating patterns formed in a thin film, made of a first oxidizable semi-conducting material, with a predetermined thickness less than or equal to 20 nm and arranged on a support, successively comprising:
   formation, on the thin film, of a mask defining, in the thin film, free zones and zones covered by the mask designed to substantially form the patterns,
   selective formation of an additional layer formed by an oxide of a second semi-conducting material, on the whole of the free zones of the thin film,
   oxidization of the free zones of the thin film,
   removal of the mask so as to release the thin film patterned in the form of patterns insulated by oxidized zones.

2. Method according to claim 1, wherein at the predetermined thickness of the thin film is less than or equal to 10 nm.

3. Method according to claim 1, wherein the second semi-conducting material is identical to the first oxidizable semi-conducting material.

4. Method according to claim 1, wherein the second semi-conducting material is different from the first semi-conducting material.

5. Method according to claim 1, wherein selective formation of the additional layer is performed by direct selective deposition of the oxide of the second semi-conducting material.

6. Method according to claim 1, wherein selective formation of the additional layer is performed by selective deposition of the second semi-conducting material followed by oxidizing thereof.

7. Method according to claim 1, wherein the additional layer has a thickness determined in such a way that the patterns remain insulated by oxidized zones throughout the duration of a micro-component fabrication method.

8. Method according to claim 1, wherein formation of the mask on the thin film comprises successive deposition, over the whole of the thin film, of two layers, respectively an oxide layer and a nitride layer, and at least selective patterning of the nitride layer to form said mask.

9. Method according to claim 1, wherein an intermediate layer is arranged between the thin film and the support.

10. Method according to claim 1, wherein the first and second semi-conducting materials are selected from the group consisting of silicon and a silicon and germanium compound.

11. Method according to claim 1, wherein the support is formed by a material different from the first oxidizable semi-conducting material.

12. Method according to claim 6, wherein selective deposition of the second semi-conducting material is performed by selective epitaxial growth of the free zones of the thin film.

13. Method according to claim 6, wherein oxidizing of the second semi-conducting material is performed at the same time as the oxidizing step of the free zones of the thin film.

14. Method according to claim 6, wherein oxidizing of the second semi-conducting material is performed before the oxidizing step of the free zones of the thin film.

15. Method according to claim 8, wherein the layers, respectively the nitride layer and oxide layer, are patterned successively.

16. Method according to claim 9, wherein the intermediate layer is an electrically insulating layer formed by a compound selected in the group consisting of amorphous silica, alumina, silicon nitride, quartz and hafnium oxide.

17. Method according to claim 9, wherein the intermediate layer is formed by a silicon and germanium compound.

* * * * *